United States Patent
Yoon et al.

(10) Patent No.: US 11,869,945 B2
(45) Date of Patent: Jan. 9, 2024

(54) GRAPHENE-BASED TFT COMPRISING NITROGEN-DOPED GRAPHENE LAYER AS ACTIVE LAYER

(71) Applicant: The Industry & Academic Cooperation in Chungnam National University (IAC), Daejeon (KR)

(72) Inventors: Soon-Gil Yoon, Daejeon (KR); Byeong-Ju Park, Daejeon (KR); Yi-Re Han, Daejeon (KR)

(73) Assignee: THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 204 days.

(21) Appl. No.: 17/428,501

(22) PCT Filed: Oct. 25, 2019

(86) PCT No.: PCT/KR2019/014120
§ 371 (c)(1),
(2) Date: Aug. 4, 2021

(87) PCT Pub. No.: WO2020/171341
PCT Pub. Date: Aug. 27, 2020

(65) Prior Publication Data
US 2022/0109052 A1    Apr. 7, 2022

(30) Foreign Application Priority Data
Feb. 20, 2019  (KR) .................. 10-2019-0019924

(51) Int. Cl.
*H01L 29/167* (2006.01)
*H01L 21/04* (2006.01)
(Continued)

(52) U.S. Cl.
CPC .......... *H01L 29/167* (2013.01); *H01L 21/041* (2013.01); *H01L 29/1606* (2013.01);
(Continued)

(58) Field of Classification Search
CPC . H01L 29/167; H01L 21/041; H01L 29/1606; H01L 29/4908; H01L 29/66045;
(Continued)

(56) References Cited

U.S. PATENT DOCUMENTS

| 2010/0102292 A1 | 4/2010 | Hiura et al. |
| 2014/0021195 A1 | 1/2014 | Kim et al. |
| 2018/0308983 A1* | 10/2018 | Yu .................. H01L 21/042 |

FOREIGN PATENT DOCUMENTS

| CN | 108461446 A * | 8/2018 | ............ H01L 21/77 |
| EP | 3179518 A1 * | 6/2017 | ....... G02F 1/134309 |

(Continued)

OTHER PUBLICATIONS

International Search Report for PCT/KR2019/014120 dated Feb. 25, 2020 from Korean Intellectual Property Office.
(Continued)

*Primary Examiner* — Shahed Ahmed
(74) *Attorney, Agent, or Firm* — Paratus Law Group, PLLC

(57) ABSTRACT

Disclosed is a high-quality and high-functional graphene-based TFT, including: a gate electrode, a gate insulating layer disposed on the gate electrode; an active layer including a nitrogen-doped graphene layer, on which disposed in a partial region of the gate insulating layer; a first electrode disposed on a region of one side of the active layer; and a second electrode disposed on a region of the other side of the active layer. The present invention allows obtaining the TFT having excellent characteristics by directly growing graphene on a Ti layer, implementing damages with remote
(Continued)

plasma, and doping with nitrogen gas to fabricate a graphene active layer.

5 Claims, 9 Drawing Sheets

(51) Int. Cl.
 *H01L 29/16* (2006.01)
 *H01L 29/49* (2006.01)
 *H01L 29/66* (2006.01)
 *H01L 29/786* (2006.01)
(52) U.S. Cl.
 CPC .... *H01L 29/4908* (2013.01); *H01L 29/66045* (2013.01); *H01L 29/78618* (2013.01); *H01L 29/78684* (2013.01)
(58) Field of Classification Search
 CPC ......... H01L 29/78618; H01L 29/78684; H01L 29/45; H01L 21/044; H01L 29/0657; H01L 29/778; H01L 21/324; H01L 29/78606; H01L 29/66742–6678; H01L 29/786–78696; H01L 27/12–13; H10K 10/46–491

See application file for complete search history.

(56) References Cited

FOREIGN PATENT DOCUMENTS

| KR | 10-2012-0078639 A | 7/2012 |
| KR | 10-2013-0011593 A | 1/2013 |
| KR | 10-2013-0042845 A | 4/2013 |
| KR | 10-2014-0118282 A | 10/2014 |
| KR | 10-1739347 B1 | 5/2017 |
| WO | WO 2008/108383 A1 | 9/2008 |

OTHER PUBLICATIONS

Xiong Sun et al., "Visible-Light Driven $TiO_2$ Photocatalyst Coated with Graphene Quantum Dots of Tunable Nitrogen Doping", Molecules, Jan. 18, 2019, pp. 1-13, No. 24, vol. 344.

* cited by examiner

A)

B)

GRAPHENE-BASED TFT COMPRISING NITROGEN-DOPED GRAPHENE LAYER AS ACTIVE LAYER

CROSS-REFERENCE TO PRIOR APPLICATIONS

This application is a National Stage Patent Application of PCT International Patent Application No. PCT/KR2019/014120 (filed on Oct. 25, 2019) under 35 U.S.C. § 371, which claims priority to Korean Patent Application No. 10-2019-0019924 (filed on Feb. 20, 2019), which are all hereby incorporated by reference in their entirety.

BACKGROUND

The present invention relates to a high-quality and high-functional graphene-based thin-film transistor (TFT) comprising a nitrogen-doped graphene layer as an active layer after being directly grown on a Ti layer.

In recent years, with the rapid progress of information technology, there has been a trend toward ubiquitous computing technologies in which information can be accessed anytime, anywhere. Accordingly, new electronic devices such as an information transmission medium and a storage medium for transmitting a variety of information are increasingly important.

In particular, consumer demands for display technologies are beyond the level of market supply and technology, and the importance of development is increasing daily. The next-generation display technology is strongly required to implement environment-friendly, low power consumption, ultra-high-resolution, large-screen with low cost, flexibility, design, transparency, and real-image (three-dimension) beyond the characteristics of light-weight, slim, high-resolution, fast switching speed, and large-screen.

A thin-film-transistor (TFT) is mounted on a backplane in a display device and plays a key role in driving the display device to the main circuit substrate that supplies power and the like. Accordingly, in order to realize ultra-high-resolution, high screen switching speed, and large-screen characteristics, and the like, which are core technologies of next-generation displays, the technology of thin-film transistors has to be developed. A conventional thin film transistor using amorphous silicon, a Low-Temperature Poly-Si (LTPS) thin-film transistor, an Indium Gallium Zinc Oxide (IGZO) thin-film transistor and the like are being developed or gaining interest. However, not only a fabrication process is still complex with a high production cost, but also is difficult to be applied to a resin substrate having high flexibility and lower thermal stability compared to an inorganic substrate such as a glass substrate, and to be used for a flexible display.

Graphene is a nanomaterial having a two-dimensional honeycomb lattice with a thickness of one carbon atom, theoretically having an electron mobility of ~200,000 $cm^2 v^{-1}s^{-1}$, the thermal conductivity of ~5000 $Wm^{-1}K^{-1}$, Young's modulus of ~1.0 TPa, having physical and chemical stability, and having an extremely small amount of visible light absorption due to a thickness on the order of an atomic layer, and exhibiting an excellent property that the light transmittance in the visible light region is about 98%. In particular, graphene is gaining attraction as a next-generation material that replaces silicon in existing silicon-based semiconductor devices, and which may be realized as a flexible, transparent electronic device, in that graphene may transfer electrons more than a hundred times faster than single crystal silicon. Graphene, however, suffers from a major drawback for its application in electronic devices such as semiconductors or transistors due to the disadvantage that graphene has no band gap and therefore has metallic properties and the on/off ratio of the operating current is so small that the flow of current may not be controlled by an electrical signal.

There had been a number of attempts made to increase an on/off ratio of the operating current by giving graphene a reasonable amount of bandgap. For example, attempts have been made to produce a hybrid structure in which the symmetry of a graphene crystal structure caused by lattice mismatch between graphene and a substrate is destroyed, a nanoribbon is formed, the chemical composition of graphene is changed, and a specific layer having semiconductor properties laminated with graphene. However, not only either of producing graphene of excellent quality, implementing the produced graphene into a nanoribbon structure, or adjusting the physical properties of graphene may not be easily done, and with the increased on/off ratio of about several thousand is still poor compared to the on/off ratio of the industrially utilized silicon-based TFT, which is $10^4$, resulting in a hindrance to mass integration and high-speed driving of devices.

SUMMARY

According to the present invention as described above, despite the excellent properties of conventional graphene itself, an on/off ratio is low with high-quality graphene is difficult to supply, and integration as a semiconductor device or a transistor using graphene as a material has not been realized.

Therefore, the present invention has been made in view of the above problems, and it is an object of the present invention to provide a graphene-based TFT, to which high-quality graphene is applied, having an on/off ratio to be commercialized, a low threshold voltage, low mobility, and a low subthreshold swing property sufficient for practical use.

To accomplish the above object, there is provided a graphene-based TFT comprising: a gate electrode, a gate insulating layer disposed on the gate electrode; an active layer including a nitrogen-doped graphene layer, on which disposed in a partial region of the gate insulating layer; a first electrode disposed on a region of one side of the active layer; and a second electrode disposed on the other side region of the active layer.

DETAILED DESCRIPTION

Hereinafter, the present invention will be in detail given with reference to the attached drawings. However, these drawings and the description thereof are intended to illustrate rather than limit the technical idea and scope of the present invention. It will be obvious to those skilled in the art that various modifications are possible within the scope of the technical idea of the present invention. The relative size, thickness, and depiction of these elements may be exaggerated or simplified for clarity, illustration, and convenience.

In the present invention, "top", "on" or "over" may include directly contacting and directly disposed on one another, as well as non-contactly disposed on via other layers. Further, in the present invention, the expression "layer (A)/layer (B)" means that layer (A) is laminated on layer (B) in direct contact therewith.

The present invention relates to a thin-film transistor (TFT) comprising an active layer including a nitrogen-doped graphene layer. More particularly, the present invention relates to a graphene-based TFT comprising: a gate electrode, a gate insulating layer disposed on the gate electrode; an active layer including a nitrogen-doped graphene layer, on which disposed in a partial region of the gate insulating layer; a first electrode disposed on a region of one side of the active layer; and a second electrode disposed on the other side region of the active layer.

Figure 1:
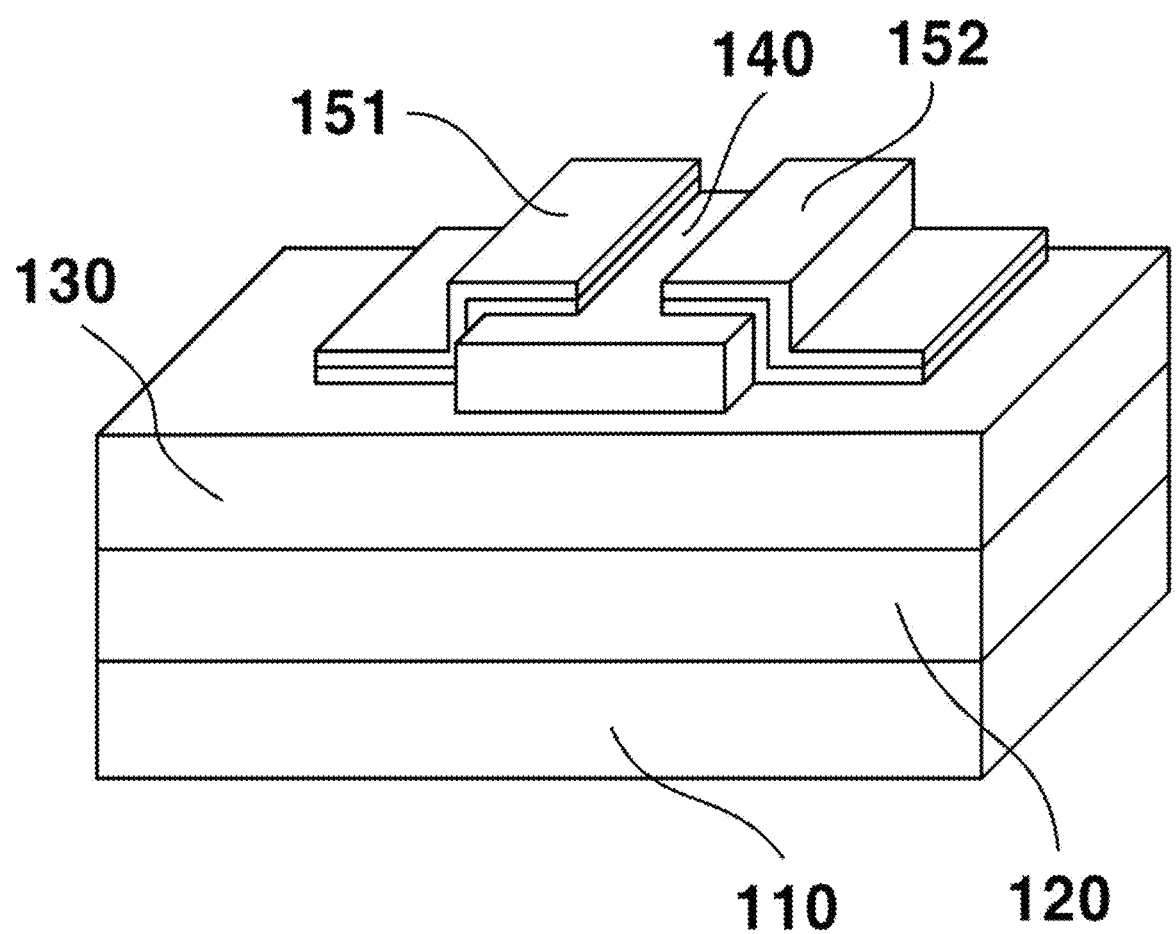
FIG. 1 is a schematic perspective view of a thin film transistor according to the present invention.

FIG. 1 is a schematic perspective view of a thin-film transistor according to an embodiment of the present invention. The thin-film transistor illustrated in FIG. 1 is a thin-film transistor of a bottom gate structure in which a gate electrode 120 is provided below an active layer 140. The gate electrode 120 may be provided on a substrate 110. The substrate 110 may be a glass substrate, but may be other substrates, that is, any one of various substrates used in conventional semiconductor device processes, such as a plastic substrate or a silicon substrate. The gate electrode 120 may be formed of general conductive material, such as metal, polysilicon, conductive oxide, or the like, and in an embodiment of the present invention, a highly doped p-Si and directly grown graphene are applied.

A gate insulating layer 130 covering the gate electrode 120 is provided. The gate insulating layer 130 may include a silicon oxide layer, a silicon oxynitride layer, or a silicon nitride layer, but may also include other material layers, such as a high dielectric material layer having a dielectric constant greater than that of the silicon nitride layer. The gate insulating layer 130 may have a structure in which at least two of such high dielectric material layers are laminated. $SiO_2$ and $Al_2O_3$ are applied in an embodiment of the present invention.

An active layer 140 comprising a nitrogen-doped graphene layer is provided on the gate insulating layer 130 of the TFT according to the present invention. In this case, the nitrogen-doped graphene layer is preferably formed by an in-situ growth method, that is, the graphene layers are deposited and continuously doped in an oxygen-free ambient, for example, in the same equipment, the graphene layers are successively deposited while doping with nitrogen.

Although the width of the active layer 140 is shown relatively smaller than that of the gate electrode 120 in the figure, and in some cases, the width of the active layer 140 may be similar to or larger than the width of the gate electrode.

On the active layer 140 of the TFT according to the present invention may be provided with a first electrode 151 and a second electrode 152 facing the first and second regions apart from each other, while in contact with the active layer 140. The first electrode 151 may be disposed in contact with one end of the active layer 140, and the second electrode 152 may be disposed in contact with the other end thereof. The first electrode 151 and the second electrode 152 may be formed of a general conductive material such as metal, polysilicon, conductive oxide, or the like. In the embodiment of the present invention, Au/Ti and graphene/Ti are applied to the first electrode 151 and the second electrode 152.

In the case where the first electrode 151 and the second electrode 152 include a conductive material layer and a Ti layer, the Ti layer is deposited in an oxygen-free ambient, and the conductive material layer is subsequently deposited, for example, Ti and the conductive material are preferably deposited successively in the same equipment.

The first electrode 151, the second electrode 152, and the gate electrode 120 may be the same material layer. The first electrode 151 and the second electrode 152 may be a single layer or multiple layers. The shape and position of the first electrode 151 and the second electrode 152 may vary. For example, the first electrode 151 may have a structure extending from one end of the active layer 140 over a region of the gate insulating layer 130 adjacent thereto, and similarly, the second electrode 152 may be a structure that extends from the other end thereof over a region of the gate insulating layer 130 adjacent thereto. The first electrode 151 and the second electrode 152 may be provided so as to be in contact with two regions other than both ends (i.e., one end and the other end) of the active layer 140.

Although not shown in FIG. 1, the thin-film transistor according to the present invention may be further provided with an etching stop layer covering the active layer 140. The etching stop layer prevents the active layer 140 from being damaged due to the etching, during the etching process for forming the first electrode 151 and the second electrode 152. The etching stop layer may include silicon oxide, a silicon nitride, and an organic insulator, or the like. At this time, the first electrode 151 and the second electrode 152 are electrically connected to the active layer 140 through a predetermined hole formed in the etching stop layer.

The TFT according to the present invention may be provided with a common passivation layer covering the exposed gate electrode 120, gate insulating layer 130, active layer 140, first electrode 151, and second electrode 152 (not shown). The protective layer may be a silicon oxide layer, a silicon oxynitride layer, a silicon nitride layer, or an organic insulating layer, or may have a structure in which at least two of them are laminated.

The TFT according to the present invention above-mentioned may take steps of a method for forming an active layer in the following manner.

First, a shadow mask corresponding to the shape of the active layer to be formed on the gate insulating layer is deposited and a titanium film having a thickness of 3-10 nm is deposited. A graphene thin-film is grown on the titanium film by in-situ remote plasma-assisted chemical vapor deposition while maintaining an oxygen-free ambient. Thus, in the present invention, the graphene layer is stably and closely formed on the gate insulating layer via the titanium layer without a transfer process. The graphene thin film grown as such is subject to a remote plasma treatment so as to apply predetermined damage to the graphene thin film. A plasma treatment condition for reasonable damage is described in the examples below. Subsequently, the damaged graphene thin film is exposed to remote plasma under the condition of N2 to be nitrogen-doped. By forming the graphene layer directly in-situ without the transfer process, a TFT of high quality and high stability is allowed. Although a shadow mask is attached to the gate insulating layer before the formation of the titanium thin film in the example, a method of patterning the active layer in any step of "after forming a titanium thin film or after the nitrogen-doping of the graphene layer" may be selected depending on the circumstances.

Although not shown, it was confirmed that when the fabricated TFT is exposed to the outside, the Ti layer under the graphene layer is partially oxidized and converted to TiO2-x. In this specification, "graphene/Ti" or "graphene/$TiO_{2-x}$" is used interchangeably depending on the time.

The TFT according to the present invention is to preferably undergo an annealing process for a predetermined time at a temperature of 100-400° C. after the fabrication. This is to eliminate plasma damage that may occur during the deposition process of the first and second electrodes and does not affect directly the characteristics of nitrogen-doped graphene. As shown in the examples below, the operating characteristics of a transistor are significantly improved by applying appropriate annealing. As the annealing temperature and time is approximately asymmetrical, those skilled in the art will be able to select appropriate annealing condition.

Although a thin film transistor of the bottom gate is mainly described above, it will become apparent to those skilled in the art to which the present inventions pertain, that the gate electrode 120, the gate insulating layer 130, the active layer 140, the first electrode 151 and the second electrode 152 may be applied in the same or similar thin-film transistors of the top gate structure conceptually inverted unlike in FIG. 1.

As shown in the example below, the thin film transistor according to the present invention exhibits excellent characteristics such that $I_{on}/I_{off}$ is 109 or more, the mobility of 300 or more, Vth (threshold voltage) is 0.3 V or less, and subthreshold swing of 0.1 V or below. Accordingly, the thin film transistor according to the present invention may be used as a pixel switching device or a driving element of an active matrix display, for example, a liquid display or an organic light-emitting diode (OLED) display, an active-matrix liquid crystal display (AMLCD) providing an ultra-high-definition (UHD) images, an active-matrix organic light-emitting diode (AMOLED). It will become apparent that the thin film transistor according to the present invention may be utilized in various applications in other electronic devices such as memory devices and logic devices.

EXAMPLES

A thin film transistor according to the present invention was fabricated and evaluated the characteristics thereof.

Fabrication of Thin Film Transistor

A thin-film transistor according to the present invention is produced as in a Substrate-Gate layer-Gate insulating layer-Active layer-Electrode by the same material respectively, as shown in Table 1 below. In production examples 1 and 2, the gate electrode serves as a substrate.

TABLE 1

|  | Production Example 1 | Production Example 2 | Production Example 3 |
|---|---|---|---|
| Substrate |  |  | polyimide |
| Gate electrode | highly doped p-Si |  | graphene/Ti |
| Gate insulating layer | SiO₂ (100 nm) |  | Al₂O₃ (~40 nm) |

TABLE 1-continued

|  | Production Example 1 | Production Example 2 | Production Example 3 |
|---|---|---|---|
| Active layer |  | N-doped graphene/Ti |  |
| First and Second Electrodes | Au/Ti |  | graphene/Ti |

In this case, the active layer formation process is performed in the following steps of forming a Ti layer on a gate insulating layer→forming a graphene layer on the Ti layer→damaging a graphene layer→doping the graphene layer, and each step and between steps are performed in an oxygen-free ambient.

Active Layer Formation

The formation of a graphene layer, the damage condition of a graphene layer, and the nitrogen-doping condition of the damaged graphene layer are determined by previous experiments. However, it does not exclude the determined conditions and other process conditions.

Graphene/Ti Layer Formation on Gate Insulating Layer

On an insulating layer of SiO₂ (Production examples 1 and 2) or Al₂O₃, a titanium layer having a thickness of 3-10 nm was deposited at 150° C. by sputtering in the following conditions; dc power of 20 W, working pressure of 0.4 Pa, deposition time of 3 minutes, the distance between gun and gun of 10 cm, and distance between plasma and substrate of 10 cm.

A graphene layer is then formed on the Ti layer under the conditions shown in Table 2 below while maintaining a continuous oxygen-free ambient.

TABLE 2

| Parameters | Graphene Synthesis Condition |
|---|---|
| Gas Injection | H₂/Ar/CH₄ = 10/10/0.3 sccm |
| Working Temperature | 150° C. |
| Working Pressure | 1.8 torr |
| Plasma Power | 70 W |
| Working Time | 2 h |
| T-T distance | 10 cm |
| T-S distance | 10 cm |

② Determining Damage Condition of Graphene Layer

Figure 2:
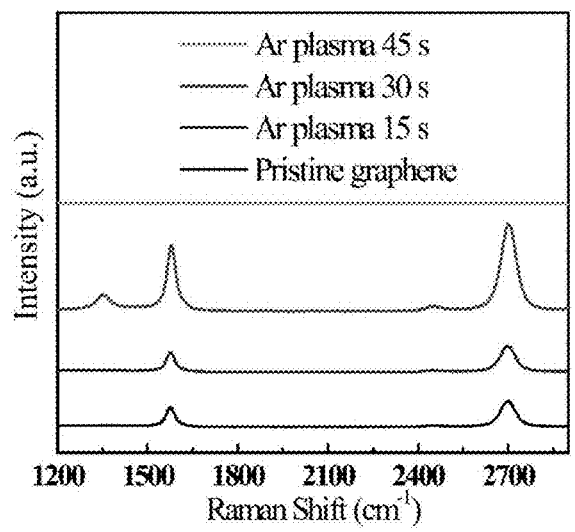
FIGS. 2 and 3 are diagrams showing a pre-experimental result for determining a transistor fabrication process condition in an embodiment of the present invention, respectively.
Figure 2:
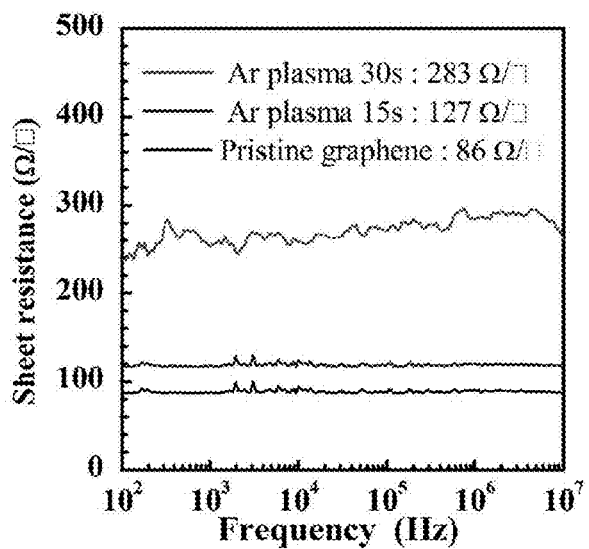
Figure 2:
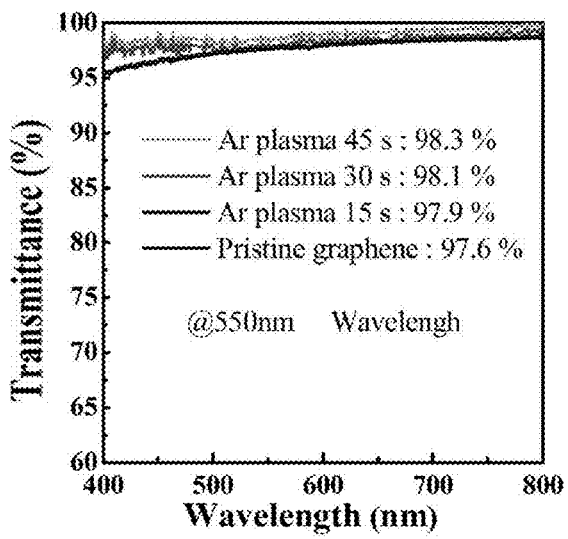

Argon (Ar) plasma exposure time was adjusted in order to determine the suitable damage condition of the graphene before doping. Under the condition shown in FIG. 2, the Ar plasma exposure (at this time, the distance between gun and gun of 10 cm, and the distance between plasma and substrate is 13 cm) time is varied for 15, 30, and 45 seconds, and the degree of damage was determined by Raman peak, surface resistance, and transparency (Refer to FIG. 2). The damages are implemented on each sample and then compared to the properties of pristine graphene. The sample exposed to the Ar plasma for 15 seconds showed no change in Raman peak and transparency but was determined that the etching (damage) is hardly done due to a small increase in the surface resistance. The sample exposed for 30 seconds was confirmed to have sufficient plasma damage through the occurrence of a slight D peak (meaning damage of graphene) in the Raman peak, and in the measurements of the surface resistance and transparency, the graphene was damaged. The sample exposed for 45 seconds, confirmed that the graphene was completely etched away in the Raman peak. Therefore, in the treatment condition as above-mentioned, it was confirmed that implementing the damage for about 30 seconds, for example, 25-35 seconds is sufficient. However, it will become apparent that the treatment time may vary according to the treatment conditions or environment.

③ Determining Nitrogen-Doping Condition of Graphene Layer

Figure 3:
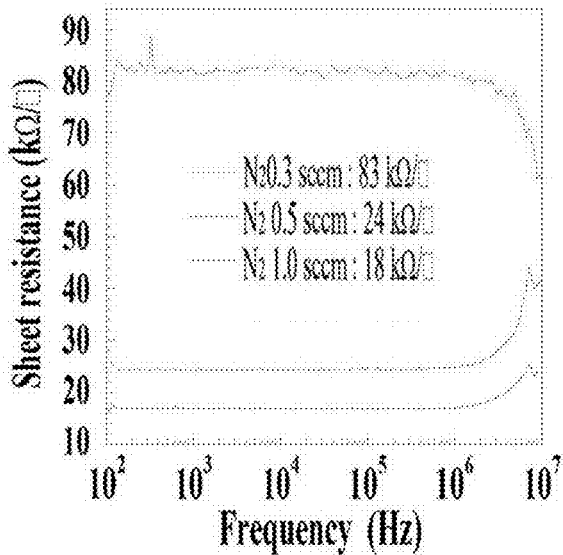
Figure 3:
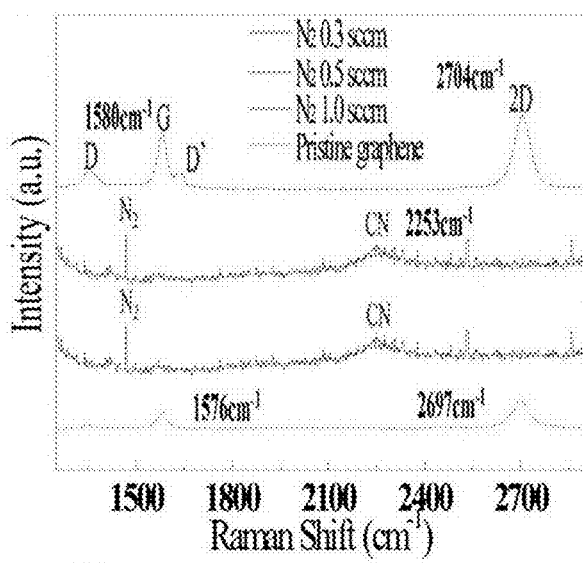
Figure 3:
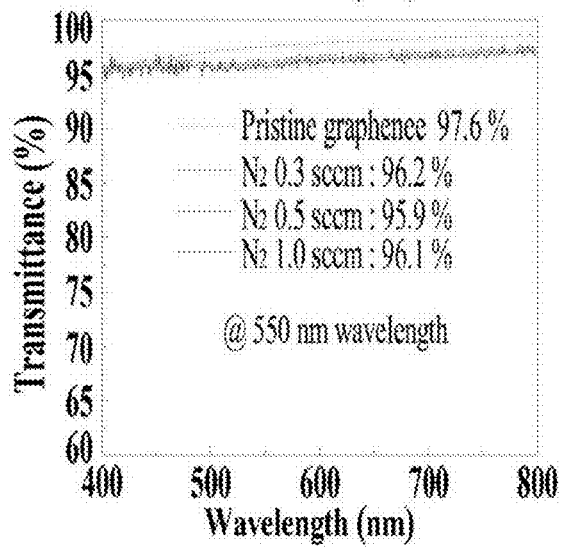

After the Ar plasma treatment was performed for 30 seconds, a nitrogen-doping was performed using $N_2$ plasma. The doping time was fixed at 30 seconds and the amount of N2 gas was adjusted to 0.3, 0.5, and 1.0 sccm to adjust a sufficient degree of doping. The sample exposed to an $N_2$ 0.3 sccm plasma (with a distance between guns is 10 cm and plasma to substrate spacing of 13 cm) exhibits a typical nitrogen-doping peak effect of G peak from 1576 $cm^{-1}$ to 1580 $cm^{-1}$. The surface resistance also increased sufficiently with the effect of nitrogen-doping, and the transparency after nitrogen doping was similar to that after Ar etching (before nitrogen-doping). This was confirmed that the sample exposed to the $N_2$ 0.3 sccm plasma was not etched and was adequately implemented the nitrogen-doped. The sample exposed to $N_2$ 0.5, 1.0 sccm plasma was etched away to confirm that graphene disappeared and some CN was formed (Refer to FIG. 3). From a test result, it was confirmed that the gas is suitable to supply at 0.3 sccm or less. In this case, also, it will become apparent that the treatment time may vary according to the treatment conditions or environment.

Production Example 1

A $SiO_2$ insulating layer was formed to a thickness of 100 nm over p-Si, which was a high doped according to a common method. Subsequently, a shadow mask was deposited on the substrate for patterning of the active layer on the insulating payer, then the Ti layer and the graphene layer were directly grown under the aforementioned conditions in succession, and the graphene layers were nitrogen-doped, thereby completing forming an active layer.

A first electrode/second electrode mask was precisely disposed on a substrate having an active layer patterned thereon, and a Ti layer (10 nm thick) and an Au layer (50 nm thick), were successively deposited by sputtering under the conditions shown below to form a first electrode and a second electrode. [Ti layer: dc power of 20 W, base pressure of $6.6 \times 10^{-4}$ Pa, working pressure of 0.4 Pa, deposition time of 3 minutes/Au layer: dc power of 12 W, base pressure of $6.6 \times 10^{-4}$ Pa, working pressure of 0.4 Pa, deposition time of 3 minutes 30 seconds] In this production example, Ti layer and Au layer were applied to the first electrode and the second electrode respectively, however, it does not exclude a conductive material to be a single layer.

Figure 4:
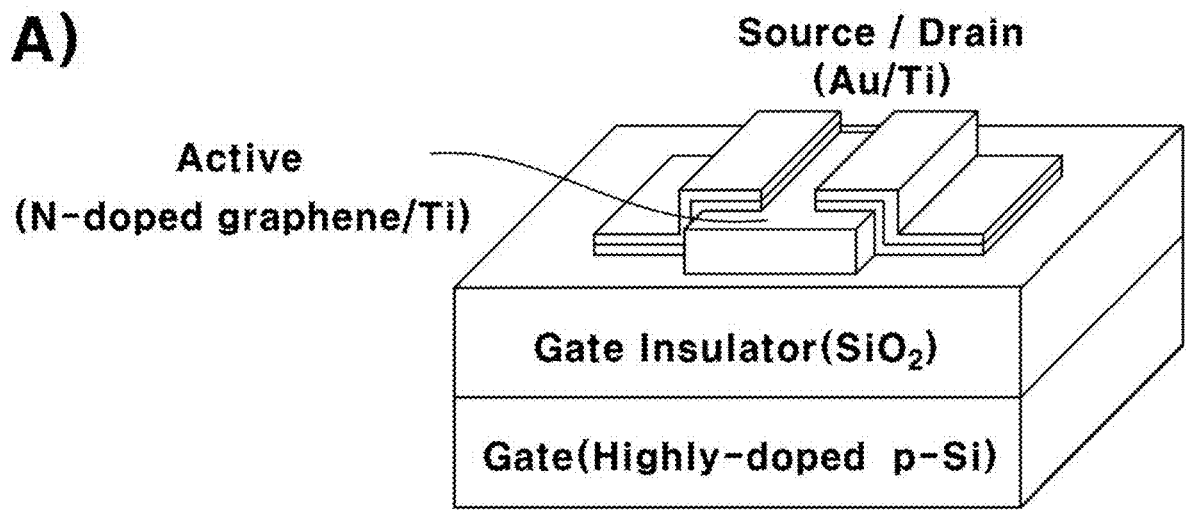
FIGS. 4 to 6 are conceptual views of a thin film transistor fabricated by an embodiment of the present invention.
Figure 4:
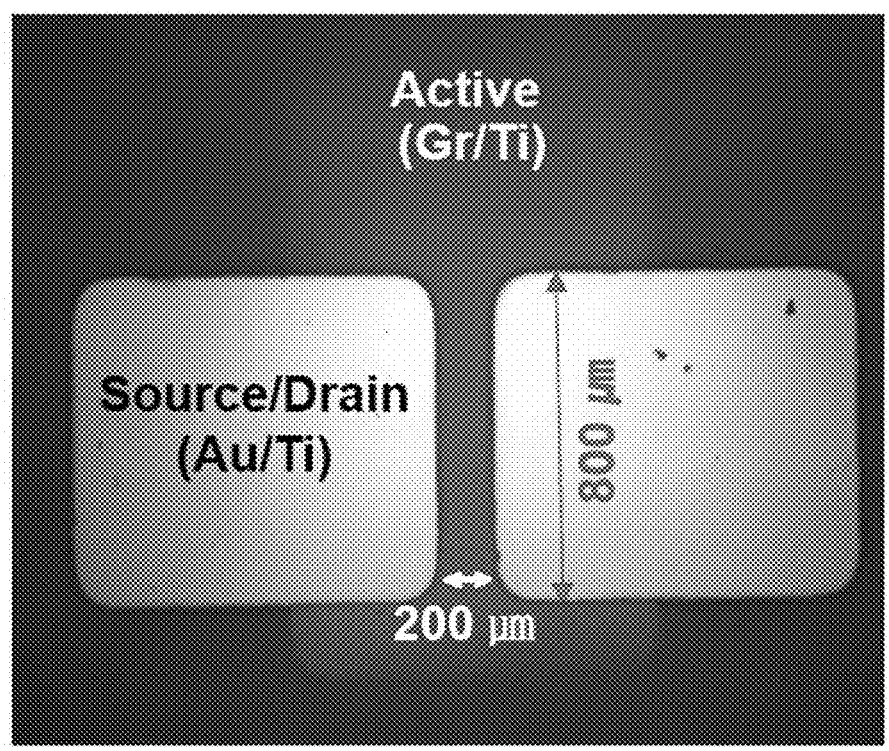

In production example 1, the size of an active layer is approximately 800×1200 µM, with a width of the first electrode and the second electrode is approximately 800 µm, and the distance between the first electrode and the second electrode is approximately 200 µM in length. (Refer to FIG. 4B) This is due to the size of the shadow mask held by the group of the present inventors, and since the smaller, the size, the better the TFT characteristics, the present production example is not intended to limit the sizes of the active layer and the first and second electrodes The fabricated transistor (Refer to FIG. 4A) was annealed at room temperature to ~300° C.

Production Example 2

Figure 5:
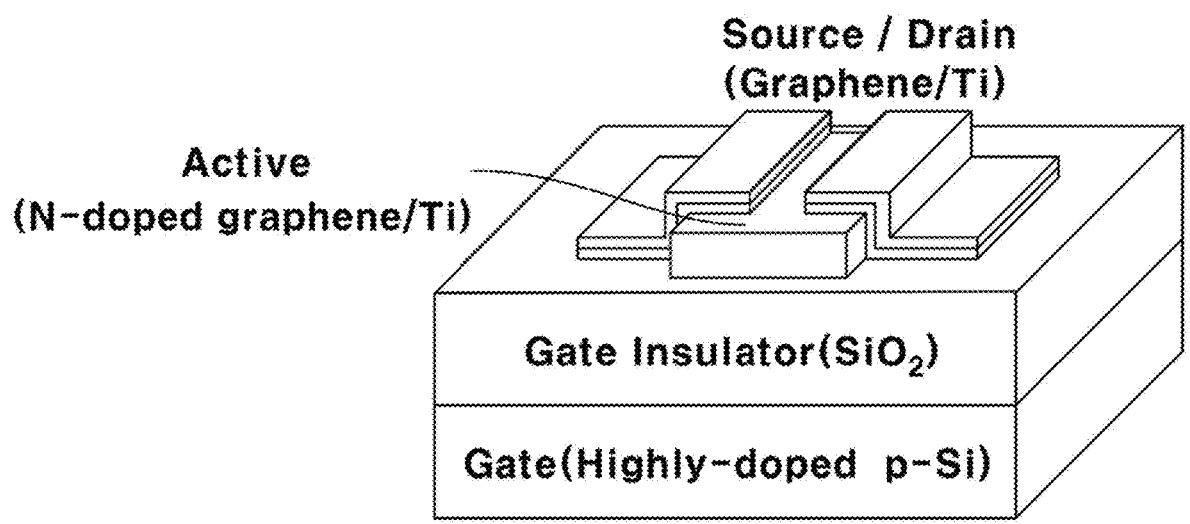

Except for a graphene layer (single layer, 0.4 nm in thickness) being directly grown on the Ti layer (10 nm thick) in the manner aforementioned to form a first electrode and a second electrode, the production example 2 was performed in the same method of production example 1 (Refer to FIG. 5).

Production Example 3

Figure 6:
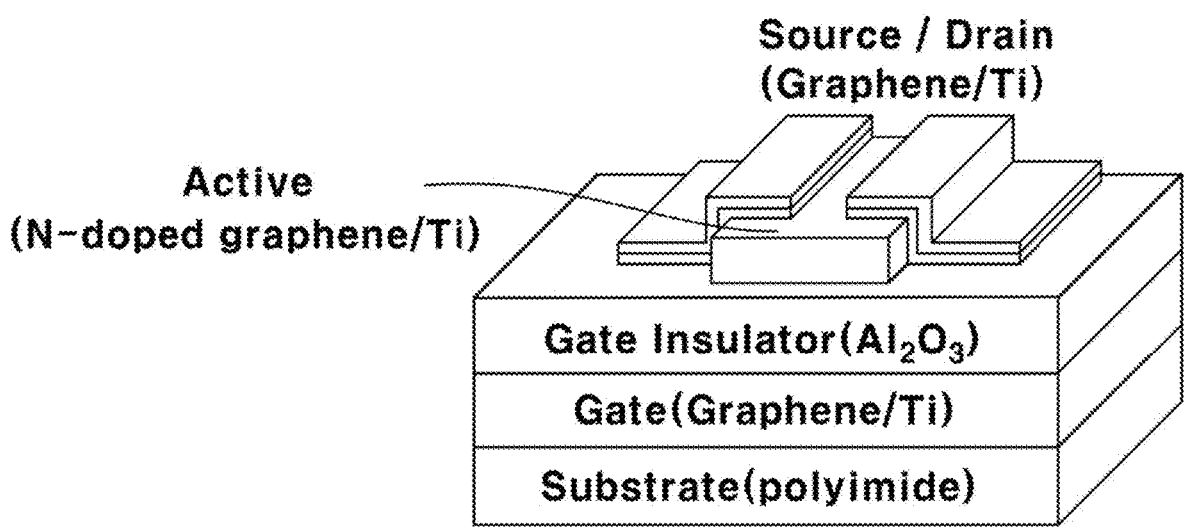

Except for a Ti layer and a graphene layer is directly formed on a polyimide substrate in an oxygen-free ambient in an above-mentioned manner to form a gate electrode, and a gate insulating layer was formed of $Al_2O_3$ (to nm thick), the Production Example was performed in the same method of production example 2 (Refer to FIG. 6).

Characteristics of Thin Film Transistor

The transfer curve, output curve, transistor characteristics according to annealing conditions of a transistor fabricated thus was analyzed.

Although not shown, it was confirmed that when the fabricated TFT is exposed to the outside, the Ti layer under the graphene layer is partially oxidized and converted to $TiO_{2-x}$.

Transistor of Production Example 1

Figure 7:
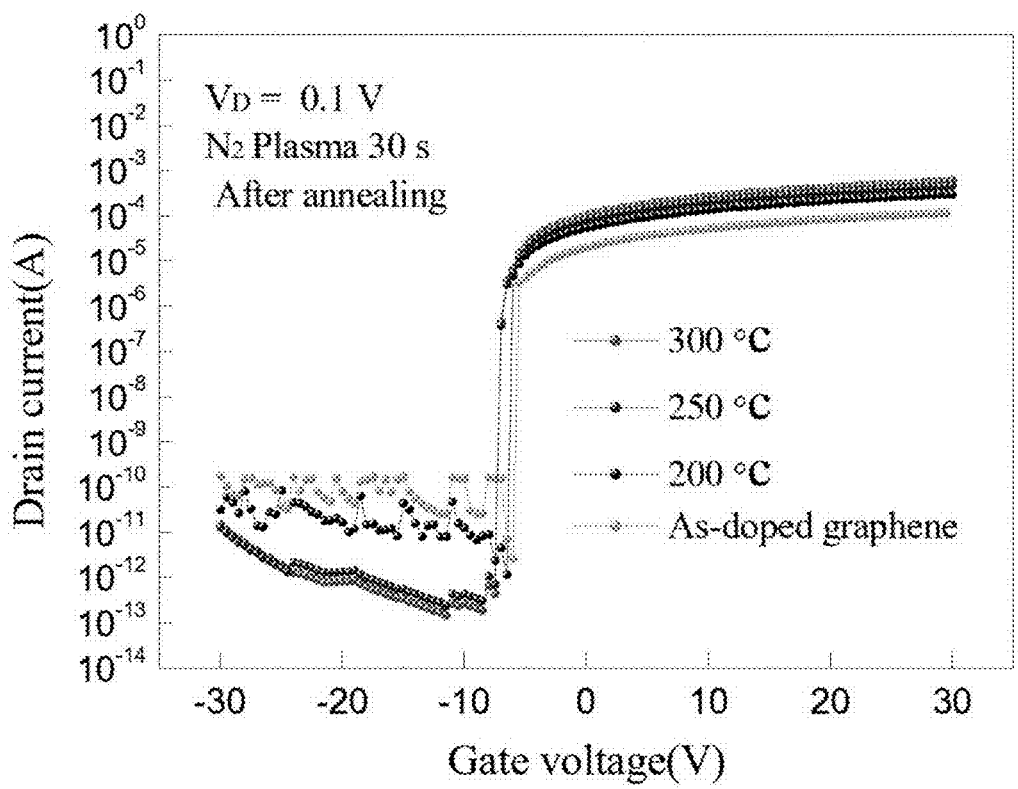
FIGS. 7 to 9 are diagrams showing operating characteristics of a thin film transistor fabricated by an embodiment of the present invention, respectively.
Figure 7:
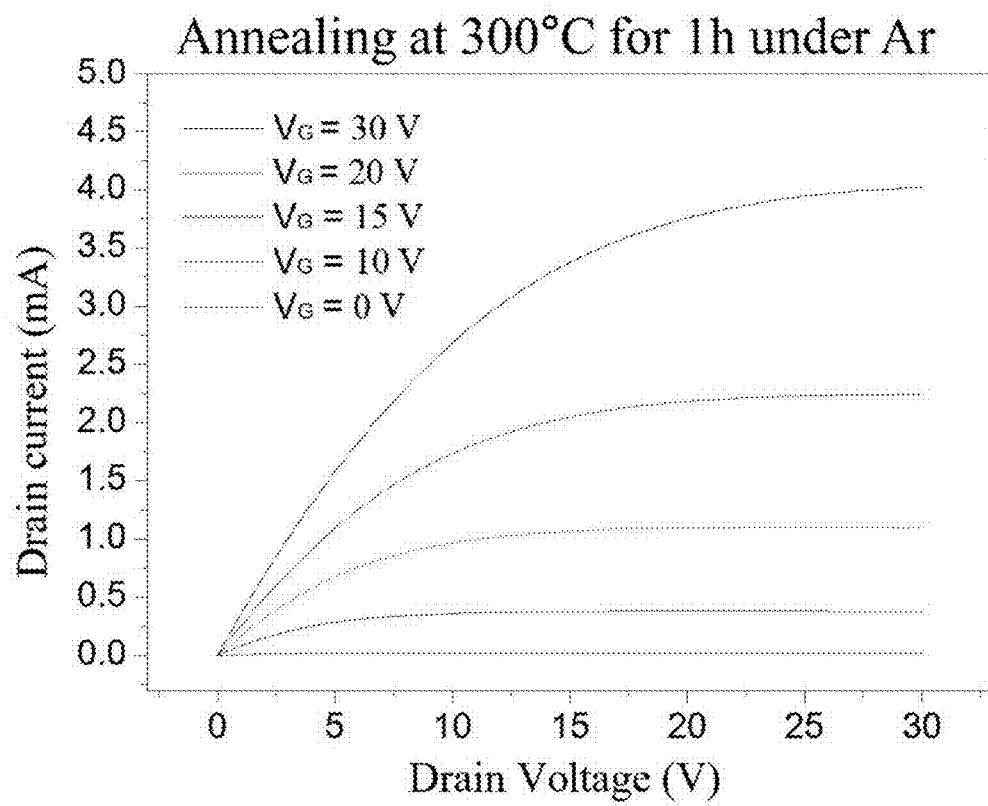

As shown in FIG. 7, a transistor of production example 1 according to the present invention exhibited a very high on/off ratio of $4.23 \times 10^7$ even before heat treatment and also exhibited superior properties when compared to the conventional nitrogen-doped graphene of 0.50 V/decade having a threshold voltage of 1.5 V at the mobility of 72 $cm^2/V \cdot s$. It may be confirmed that when the production example 1 of a transistor is treated at 200, 250, 300° C., the performance of the transistor is gradually improved. It is understood that defects occurring between the active layer and the electrode layer interface, which are produced when Au and Ti are deposited on the first electrode and the second electrode by DC sputtering, and the physical stress generated when electrode layers are deposited are alleviated due to the heat treatment so that the natural characteristics of the nitrogen-doped graphene transistors are exhibited.

As shown in Table 3 below, these nitrogen-doped transistors exhibit excellent characteristics, including on/off ratio ($I_{on/off}$), mobility, threshold voltage, subthreshold swing (S.S.), and the like.

TABLE 3

| Parameter | No Annealing | 200° C. | 250° C. | 300° C. |
|---|---|---|---|---|
| $I_{on}$ | $1.13 \times 10^{-4}$ A | $4.31 \times 10^{-4}$ A | $6.60 \times 10^{-4}$ A | $6.90 \times 10^{-4}$ A |
| $I_{off}$ | $2.65 \times 10^{-12}$ A | $1.67 \times 10^{-12}$ A | $1.76 \times 10^{-13}$ A | $1.75 \times 10^{-13}$ A |
| $I_{on}/I_{off}$ | $4.23 \times 10^7$ | $4.97 \times 10^8$ | $3.75 \times 10^9$ | $3.84 \times 10^9$ |
| Mobility | 72 $cm^2/V \cdot s$ | 127 $cm^2/V \cdot s$ | 301 $cm^2/V \cdot s$ | 303 $cm^2/V \cdot s$ |

TABLE 3-continued

| Parameter | No Annealing | 200° C. | 250° C. | 300° C. |
|---|---|---|---|---|
| $V_{th}$ | 1.5 V | 0.44 V | 0.41 V | 0.39 V |
| Subthreshold Swing | 0.50 V/decade | 0.21 V/decade | 0.11 V/decade | 0.11 V/decade |

Transistor of Production Example 2

Figure 8:
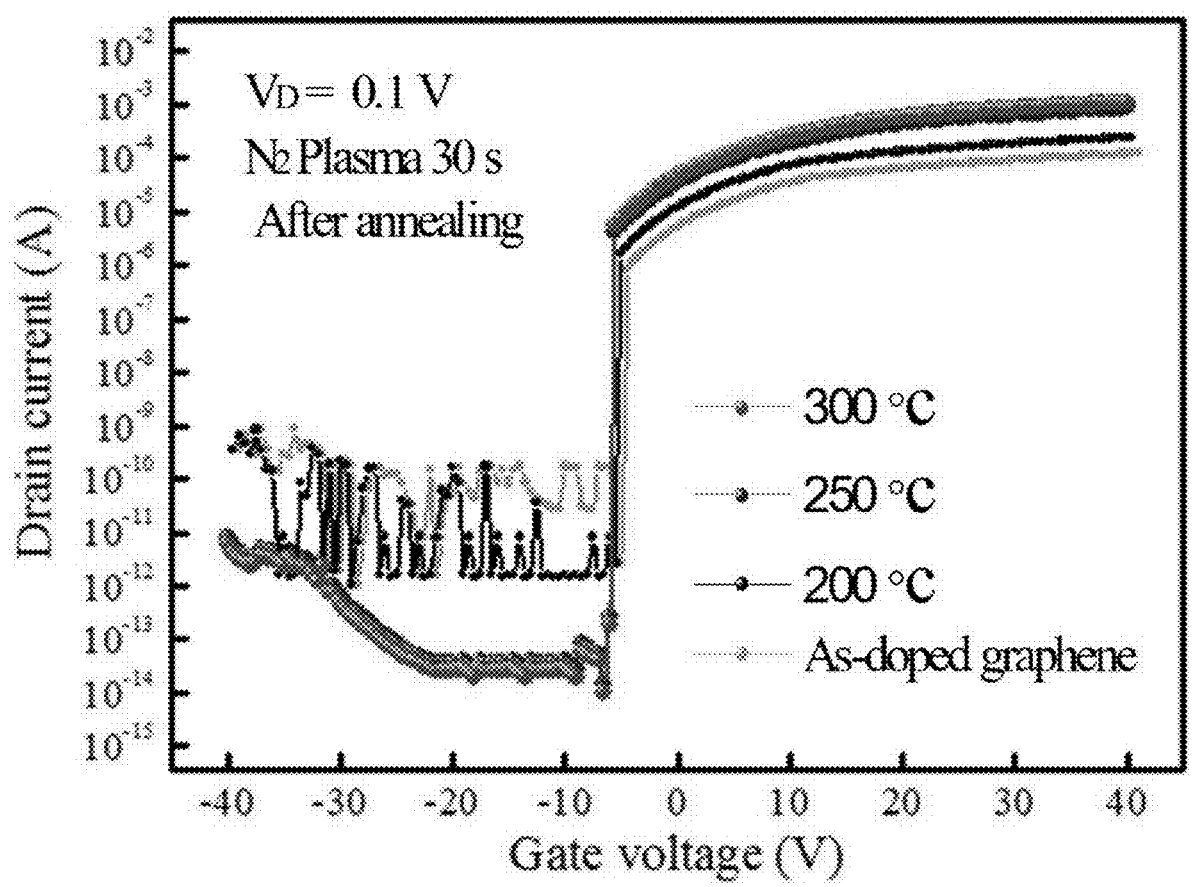

As shown in FIG. 8, in a transistor of production example 2, a first electrode and a second electrode are replaced with graphene/Ti electrodes. It was confirmed that when the heat treatment was performed at 200, 250, 300° C., as in the case of the production example 1 of a transistor, the higher the temperature, the better the performance of the transistor was, and the reason was as above-mentioned.

Accordingly, it has been confirmed that the graphene/Ti electrodes may be sufficient to replace the Au/Ti electrodes.

Further, as shown in Table 4 below, it may be seen that the replacement of the Au/Ti electrode with the graphene/Ti electrodes still has an excellent on/off ratio ($I_{on/off}$), mobility, threshold voltage, and subthreshold swing, and the like.

TABLE 4

| Parameter | No Annealing | 200° C. | 250° C. | 300° C. |
|---|---|---|---|---|
| $I_{on}$ | $1.05 \times 10^{-4}$ A | $2.31 \times 10^{-4}$ A | $3.47 \times 10^{-4}$ A | $3.50 \times 10^{-4}$ A |
| $I_{off}$ | $1.75 \times 10^{-12}$ A | $1.67 \times 10^{-12}$ A | $1.02 \times 10^{-13}$ A | $9.94 \times 10^{-14}$ A |
| $I_{on}/I_{off}$ | $6.00 \times 10^{7}$ | $1.38 \times 10^{8}$ | $3.40 \times 10^{9}$ | $3.52 \times 10^{9}$ |
| Mobility | 101 cm²/V·s | 117 cm²/V·s | 291 cm²/V·s | 293 cm²/V·s |
| $V_{th}$ | 1.38 V | 0.44 V | 0.34 V | 0.33 V |
| Subthreshold Swing | 0.34 V/decade | 0.26 V/decade | 0.10 V/decade | 0.10 V/decade |

Transistor of Production Example 3

Figure 9:
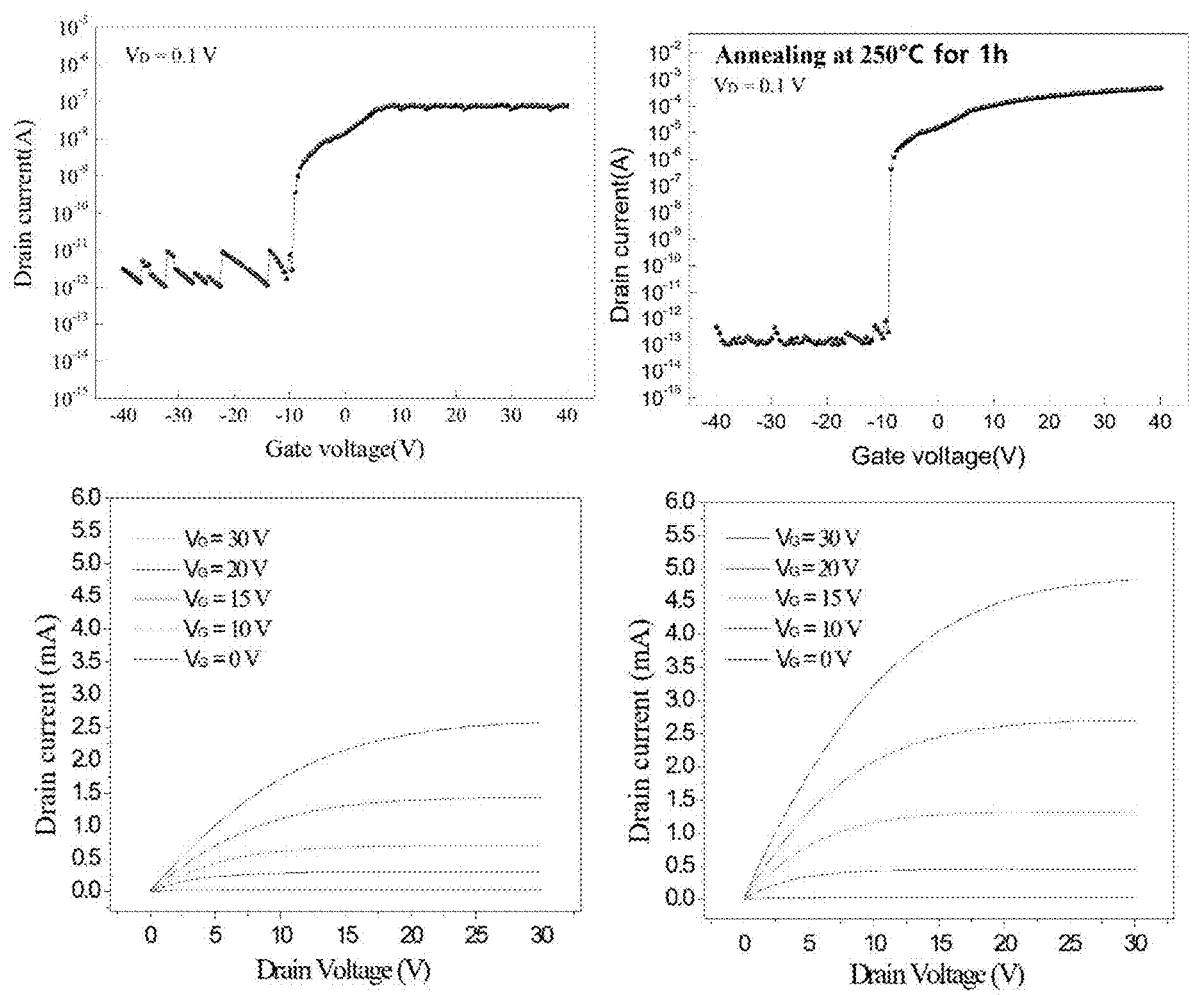

As shown in FIG. 9, a transistor of production example 3 was fabricated for a transparent and flexible nitrogen-doped graphene transistor implementation by replacing the existing Si-based substrate and gate insulating layer with a flexible PI substrate and a flexible $Al_2O_3$ gate insulating layer and using the graphene/Ti first and second electrodes. It may be confirmed that like in production example 1 and 2 when the heat treatment was performed at 250° C., the performance of the transistor is improved. The heat treatment test was omitted at a higher temperature because of the degradation of the PI substrate.

Further, as shown in Table 5 below, it may be seen that exhibits excellent on/off ratio ($I_{on/off}$), mobility, threshold voltage, and subthreshold swing, and the like, even in the case of a flexible electrode is applied.

TABLE 5

| Parameters | No Annealing | 250° C. |
|---|---|---|
| $I_{on}$ | $1.53 \times 10^{-7}$ A | $2.29 \times 10^{-4}$ A |
| $I_{off}$ | $1.14 \times 10^{-12}$ A | $1.01 \times 10^{-13}$ A |
| $I_{on}/I_{off}$ | $1.34 \times 10^{5}$ | $2.26 \times 10^{9}$ |
| Mobility | 44 cm²/V·s | 260 cm²/V·s |
| $V_{th}$ | 1.1 V | 0.8 V |
| Subthreshold Swing | 1.07 V/decade | 0.22 V/decade |

Figure 10:
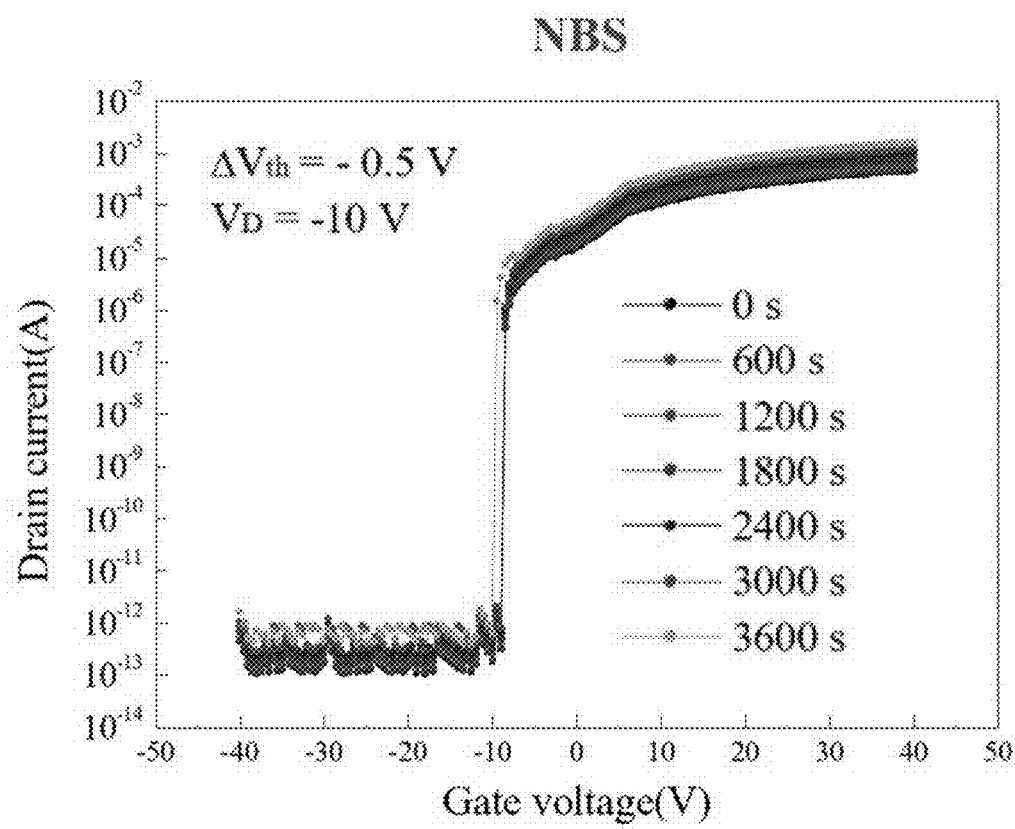
FIG. 10 is a diagram showing the stability of the fabrication example 3 devices in an embodiment of the present invention.
Figure 10:
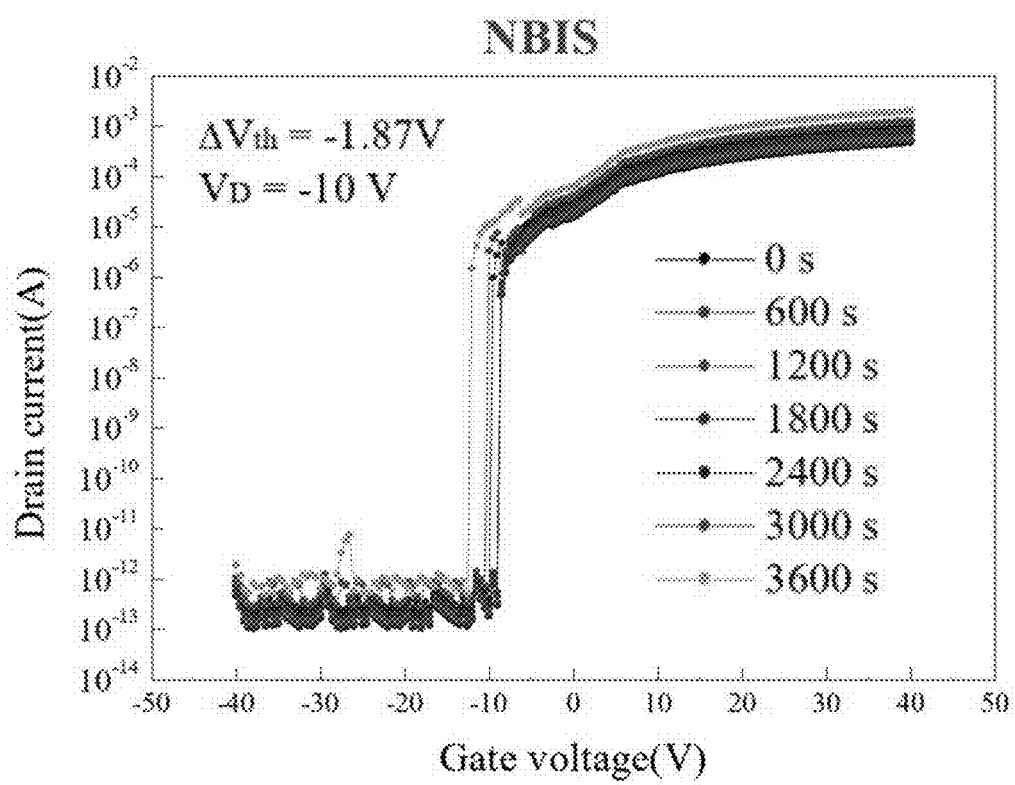

The device stability of the production example 3 in which a transparent and flexible nitrogen-doped graphene transistor was fabricated was confirmed through the Negative Bias Stress (NBS) and the Negative Bias Illumination Stress (NBIS) measurements (Refer to FIG. 10). As a result of the NBS measurement, production example 3 showed a very stable device characteristic in which the measurement value did not vary even after 3600 seconds, and in the NBIS measurement in which Illumination was set at 1500 lux. This has excellent characteristics with stability comparable to that of ZnON—F (oxide semiconductor, ACS Applied Materials & Interfaces, 2017, 9, 24688), which has been reported to be very stable.

According to the present invention, as described above, a graphene-based TFT may be utilized in a high-density semiconductor, a transistor, or the like, due to high carrier mobility, and a sufficiently high on/off ratio.

Further, according to the present invention, a reduction of fabrication cost and a high-quality product is possible by simplifying the fabrication process, in which graphene is synthesized continuously in the same equipment when an active layer is formed.

What is claimed is:

1. A graphene-based TFT comprising:
   a gate electrode;
   a gate insulating layer disposed on the gate electrode;
   an active layer including a $TiO_{2-x}$ layer directly disposed on and above a partial region of the gate insulating layer and a nitrogen-doped graphene layer directly disposed on and above the $TiO_{2-x}$ layer, which are formed by directly growing a first graphene layer after depositing a Ti layer on the gate insulating layer in an oxygen-free atmosphere and then doping the first graphene layer with nitrogen;
   a first electrode disposed on a region of one side of the active layer; and
   a second electrode disposed on a region of the other side of the active layer.

2. The graphene-based TFT of claim 1, wherein the gate electrode includes a second graphene layer.

3. The graphene-based TFT of claim 1, wherein the first electrode and the second electrode include a $TiO_{2-x}$ layer formed on the active layer and a third graphene layer formed on the $TiO_{2-x}$ layer of the first electrode and the second electrode.

4. A fabrication method of a graphene-based TFT of claim 1, comprising the active layer formation in steps of:

depositing a shadow mask corresponding to the shape of the active layer to be formed on the gate insulating layer, and depositing a titanium film having a thickness of 3-10 nm;

growing a graphene thin film by in-situ to a remote plasma-assisted chemical vapor deposition while maintaining an oxygen-free ambient;

applying predetermined damage to the graphene thin film grown by performing a remote plasma treatment;

exposing the damaged graphene thin film to a remote plasma in an N2 ambient to perform nitrogen doping.

5. The method of claim 4, further comprising:

annealing for a predetermined time at 100-400° C. after forming the first electrode and the second electrode, subsequently forming the active layer.

* * * * *